United States Patent [19]

Konicek

[11] 3,990,926

[45] Nov. 9, 1976

[54] METHOD FOR THE PRODUCTION OF MATERIAL FOR PRINTED CIRCUITS

[75] Inventor: Jiri K. Konicek, Lund, Sweden

[73] Assignee: Perstorp AB, Perstorp, Sweden

[22] Filed: May 22, 1975

[21] Appl. No.: 579,911

Related U.S. Application Data

[63] Continuation of Ser. No. 283,955, Aug. 28, 1972, abandoned.

[30] Foreign Application Priority Data

Aug. 30, 1971 Sweden.............................. 10929/71

[52] U.S. Cl. ........................................ 156/3; 156/7; 156/8; 156/18; 156/22; 156/151; 156/155; 156/233; 156/238; 156/239; 156/241; 156/330; 204/13; 204/15; 204/40; 204/43 R

[51] Int. Cl.² .................. C23F 01/00; C09J 05/06; C25D 05/10

[58] Field of Search ................... 156/3, 7, 8, 18, 22, 156/11, 150, 151, 155, 233, 238, 239, 241, 249, 330, 344; 204/13, 15, 20, 22, 23, 24, 27, 32 R, 33, 34, 46, 43 R; 174/68.5; 29/625; 428/417, 418, 457

[56] References Cited

UNITED STATES PATENTS

| 1,157,619 | 7/1969 | UK | |
| 2,680,699 | 6/1954 | Rubin .............................. | 204/20 X |
| 2,721,822 | 10/1955 | Pritikin .............................. | 156/150 |
| 2,984,595 | 5/1961 | Schumpelt et al. .................. | 156/151 |
| 3,203,876 | 8/1965 | Deyrup ............................ | 156/150 X |
| 3,240,684 | 3/1966 | Martin et al. ....................... | 156/8 X |
| 3,536,545 | 10/1970 | Traynor et al. ..................... | 156/3 |
| 3,634,168 | 1/1972 | Janssen et al. ..................... | 156/150 X |
| 3,660,190 | 5/1972 | Stroszynski ........................ | 156/150 |
| 3,672,986 | 6/1972 | Schneble, Jr. et al. .............. | 156/8 X |

FOREIGN PATENTS OR APPLICATIONS

| 778,661 | 7/1957 | United Kingdom |
| 853,422 | 11/1960 | United Kingdom |
| 1,157,618 | 7/1969 | United Kingdom |
| 1,157,619 | 7/1969 | United Kingdom |

Primary Examiner—William A. Powell
Assistant Examiner—Thomas Bokan
Attorney, Agent, or Firm—Stevens, Davis, Miller & Mosher

[57] ABSTRACT

A method for the production of a material for printed circuits is disclosed. A temporary base is coated by electroplating with a thin, unbroken and unpatterned metallic layer having a thickness less than 17μm and the free surface of said metallic layer is bonded to a final insulating base. The temporary base is thereafter removed and the desired wiring pattern is produced by a process comprising etching of the metal layer. A material for use in production of printed circuits is also disclosed comprising a temporary base which is coated by electroplating with a thin, unbroken and unpatterned metal layer having a thickness less than 17μm. Said material can comprise a final, insulating base bonded to the free surface of the thin metal layer.

9 Claims, 17 Drawing Figures

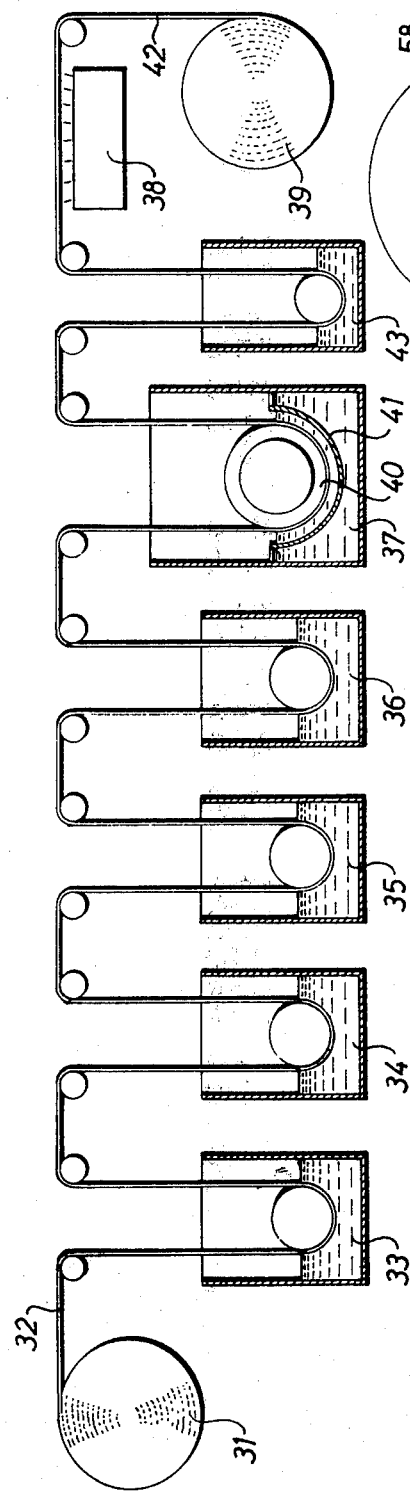
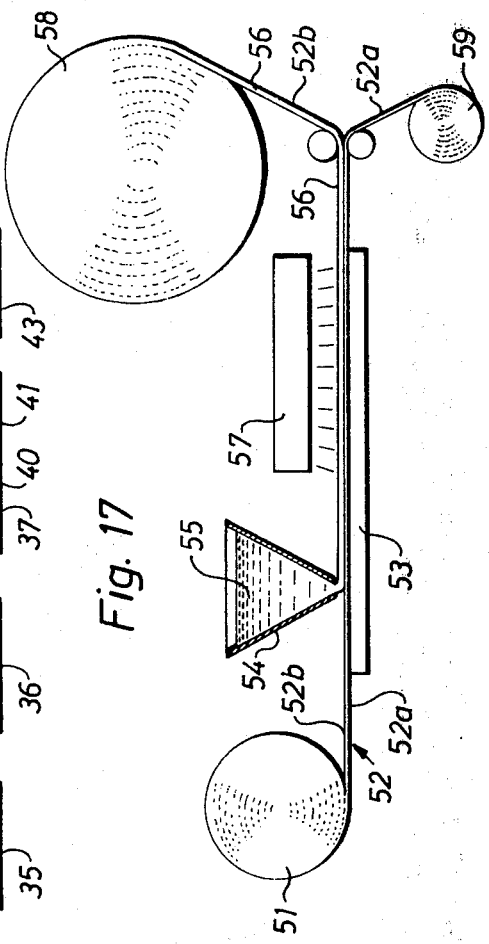
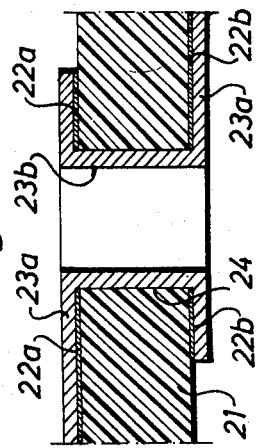

METHOD FOR THE PRODUCTION OF MATERIAL FOR PRINTED CIRCUITS

This is a continuation of application Ser. No. 283,955, filed Aug. 28, 1972, now abandoned.

The present invention relates to a method for producing material for printed circuits, said material comprising a thin layer of metal on an insulation-carrier or base.

Printed circuits are used to a large extent in the electronics industry. They are usually produced with a copperclad plastic laminate as starting material. A copy of the desired wiring pattern is transferred to the copper layer by printing or by a photochemical method. The applied copy, the so-called etch resist acts as a protection during a subsequent elimination by etching of superfluous copper. Thereafter electronic components are mounted to the laminate with the circuit thus obtained. The copper conductors of the circuit constitute the electrical connections and the laminate provides the required mechanical support. This technique provides good possibilities of space and weight saving build-up of the electronic unit. The method affords high reliability and rational production.

The most common bases are paper-reinforced phenolic laminates which are used for comparatively simple circuits, and glass cloth reinforced epoxy resin laminates which are used where the technical requirements are high. Use is also made of fibre reinforced plastic laminates of other types. Base materials of the type plastic films and plastic coated metal plate are also used to a certain extent. For producing the copper coating or layer it is common to use copper foils or sheets which are placed on a base-forming fibre material impregnated with partially cured or hardened plastic (so called prepreg) whereupon the composite material is moulded at high pressure and increased temperature. The final curing of the plastic is thereafter effected whereby the fibre material is converted into a sheet bonded to the copper foil. The copper foil has usually a thickness of 35 $\mu$m, but also thicker and thinner foils can be used. According to another known method the copper foil is glued to a plastic film by means of heat and pressure.

Owing to the rapid development in the electronics field the demand for printed circuits with good dimensional precision, especialy in circuitry with small line width and small distances between conductors, is increasing. Already at present printed circuits with a line width of 0.2 mm are required in many cases. Even smaller dimensions have been used and the need thereof is supposed to increase in the future. This development has led to a demand for laminates with thinner copper layers. Lately laminates with 17 $\mu$m thick copper foils have come into use to an increasing extent. By using thinner copper foils advantages are gained, i.a. a decrease of so-called "undercut". By undercut is meant the elimination of copper under the etch resist caused by the etching solution which while dissolving the unprotected portions of the copper layer also eats into the copper covered by the etch resist. The undercut is a difficult problem causing unacceptably low dimensional accuracy especially in circuits with fine-line conductors. The effect of the undercut at varying thickness of the copper layer shall be explained in more detail in the following description.

By means of a suitable technique it is possible to obtain a high degree of precision in the application of the etch resist proper. However, owing to the undercut, difficulties arise in maintaining the good dimensional accuracy as to, for instance, the line width which the technique involving masking by means of an etch resist makes possible per se.

For some applications, very exactly defined distances between conductors are required, even or ordinary-dimension circuits. This is particularly true in applications, where electrical influence between conductors must be considered, i.a. in electronic systems which are to operate at high frequencies.

Thin copper-layer clad laminates can be used with advantage also for this purpose.

There are other advantages with thinner copper layers. Thus, the etching time is considerably reduced and the amount of etching solution consumed is also reduced. The amount of copper required for obtaining the copper layer is likewise reduced. For these reasons thin copper layers can be favorable also if the requirements as to the dimensional accuracy are not very high.

If an increased thickness of the copper conductors is desirable the thickness can be increased by chemically or electolytically depositing copper according to known techniques. By this procedure copper is deposited only on the portions of the coper layer constituting the conductors of the final printed circuit which portion usually is the minor portion of the total surface of the printed circuit. By suitable techniques the increase of the thickness of the copper layers can be effected with good dimensional accuracy and in the case of insulation bases which are provided at both sides thereof with a conductor pattern of copper the increase of the copper thickness can suitably be carried out in connection with a so-called through-holes plating which is a method often used for providing electrical connections between the printed circuits on each sides of the base and for providing holes for the mounting of electrical components. Thus, no extra process step is required to increase the thickness of the conductors. The method also gives the advantage that the main portion of the conductors of the circuit and the copper layer in the holes will consist of homogenous and simultaneously deposited metal which is favorable from the point of view of reliability.

From the above discussion the advantages gained by using bases with thinner metal layers than what is usual at present in the manufacture of printed circuits clearly appear. In a common method for the production of metal coated, insulating bases for printed circuits an unbroken or continuous, non-patterned metal foil or sheet is used as a starting material which foil is bonded to the base by moulding at increased temperature or in other manner. The most commonly used metal foil is a copper foil produced electrolytically. Such a copper foil has a high degree of purity. However, considerable problems occur if an insulating base with a copper foil having a thickness less than 17 $\mu$m shall be produced according to this method, since there are great dfficulties in connection with the practical handling of such thin copper foils. Another considerable disadvantage of this known method in the case of very thin copper foils produced electrolytically is due to the fact that the copper foil has often cavities and through-going holes, so called micropores, the latter being, for reasons easily realized, more difficult to avoid with decreased thickness of the foil. During the moulding of the laminate still uncured resin material can penetrate through the pores and accumulate on the free surface of the foil where it can give raise to great difficulties i.a. during the subsequent etching of the copper foil when the resin on the surface act as an unwanted etch-resist.

Another method has been suggested according to which a thin copper layer is deposited on an insulating base by direct plating on the base. Such plating must be effected at least partly by other method than by electroplating since the carrier is of an insulating material. An applied method is chemical plating which, however, is comparatively expensive and complicated. Thus, for instance, the surface of the laminate must often be pretreated for assuring good bending of the deposited copper. This pretreatment can give rise to deep cavities in the base which cavities will be filled by copper at the plating procedure. This necessitates relativvely long etching times for assuring that all copper is removed from the etched portions of the laminate. The prolonged etching time increases the production costs and will also lead to an increased undercut even in the case of laminates with thin chemically deposited copper layers.

For completing the picture of the prior art in the manufacture of materials for printed circuits a method shall be mentioned which is described in, for instance, the U.S. Pat. No. 2,692,190. According to this patent a final wiring pattern of copper is applied to or formed on a temporary base whereupon this base with the pattern facing a final, insulating base, and with the resin material of the base still uncured is moulded to the final base. In the moulding operation the wiring pattern is usually brought to penetrate into the final base. After final curing or hardening the temporary base is removed, for instance by etching. This method which has been described in connection with ordinary copper layer thicknesses has often the purpose of providing a final printed circuit in which the surface of the wiring pattern is situated at the same level as the surrounding surface of the insulating base. This makes it possible to use so-called glide contacts in the circuit arrangement for which the circuit is to be used. However, it has turned out that this known method has certain inconveniences which can cause troubles at least in certain applications. Some of these inconveniences have been discussed in the British Pat. No. 1 116 299, and in connection with the present invention it shall be further pointed out that practical and economical difficulties arise when the method shall be used for the production of printed circuits with a very high degree of precision which is required i.a. in the manufacture of circuits with very narrow wiring pattern conductors and very small distances between the conductors. After the etching the temporary base with the wiring must be handled and transported and moulded to the final insulating base and these steps combine to decrease the accuracy of the method. It is also to be undertstood that the method is practically unusable if laminates with wiring patterns on each side of the final base and with so-called through-holes plating shall be produced. Finally it should be pointed out that an increase of the thickness of the copper conductors on the final base is connected with great difficulties if a high degree of accuracy is desired.

The inconveniences of the known methods pointed out above are avoided to a very high degree by the application of the present invention.

A method according to the invention for the production of a material for printed circuits which material comprises a layer of metal on an insulating base is characterized in that a thin, unbroken and unpatterned metal layer having a thickness less than 17 $\mu$m is applied by electroplating to a temporary base, preferably of a throw-away type, in the form of a metal foil of aluminum, zinc or their alloys or steel, that the free surface of the said, on the temporary base electroplated, thin metal layer is brought to a strong adhesion to a final, insulating base and that the temporary base is removed, whereupon desired wiring patterns of printed circuits can be produced by a process comprising etching of the metal layer bound to the final insulating base.

The thickness of the thin metal layer, should according to the invention be between 1 and 15 $\mu$m, preferably between 2 and 10 $\mu$m, and can be, for instance about 5 $\mu$m.

It is not necessary to carry out the various steps of the method according to the invention one immediately after the other and in one and the same locality but the procedure can be divided in time and space by seaparately producing one or more intermediate products which are thereafter subjected to complementary treatment for carrying out the complete method according to the invention.

The thin metal layer which is to form the wiring pattern can suitably consist of copper or nickel or their alloys. The metal layer can be a single layer or consist of a combination of two or more layers of different metals or alloys thereof. Other metals than those mentioned above and other combinations of metals can also be used.

The final, insulating base can suitably consist of a stiff sheet of plastic which may be fibre-reinforced, for instance of a sheet of glass fibre reinforced epoxy resin, but it can also consist of a plastic film which may likewise be fibre-reinforced.

According to a further development of the invention for application especially in the case when a foil of aluminum or an alloy thereof is used as a temporary base a relatively thin layer of zin, tin or their alloys can be applied on the surface of the temporary base facing the metal layer, before applying the metal layer by electroplating.

The invention also relates to a material for printed circuits produced by the method according to the invention and to materials intended to be used in the form of intermediate products for carrying out the method according to the invention. A first intermediate product consists of a temporary base of a throw-away type in the form of a foil of aluminum, zinc or their alloys or steel with at least one unbroken or continuous, thin layer of metal applied by electroplating, said layer having a thickness less than 17 $\mu$m, suitably a thickness of 1 – 15 $\mu$m, and preferably a thickness a 2 – 10 $\mu$m. A second intermediate product consists of said first intermediate product laminated or moulded with the final insulating base with the thin metal layer facing the final base and bound thereto.

The invention will be more fully described hereinbelow with reference to the drawings. In the drawings, FIGS. 1 – 3 illustrate the influence of the thickness of the copper layer on the so called undercut in an etching procedure.

FIG. 15 illustrates the result after a so called through-holes plating.

FIG. 16 shows schematically a device for producing, according to the invention, materials for printed circuits and FIG. 17 illustrates schematically a further embodiment of the method according to the invention.

Figure 1:
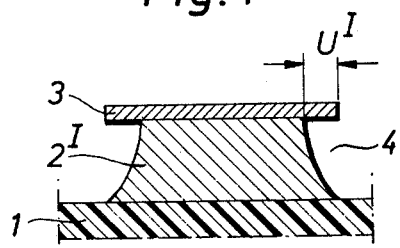
Figure 2:
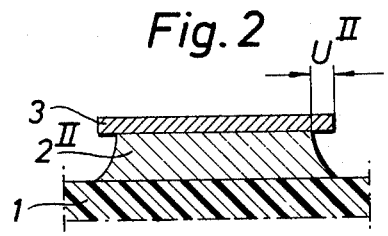
Figure 3:
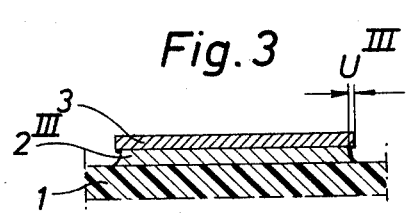
Figure 4:
FIGS. 4 – 10 illustrate a method according to one embodiment of the invention.

In FIGS. 1 – 3 there is shown in cross-section a metal layer of copper $2^I$, $2^{II}$ and $2^{III}$ respectively, of a printed circuit, said layer being bonded to an insulating base 1 and covered by an etch resist 3. In FIG. 1 the reference 4 designates the cavity in the metal layer under the etch resist caused by the etching. $U^I$ being the measure of the undercut. In FIGS. 2 and 3 the undercut is designated with $U^{II}$ and $U^{III}$ respectively. The metal layer $2^I$ according to FIG. 1 is relatively thick, about 35 $\mu$m, and requires a long etching time, the undercut being in this case considerable. The metal layer $2^{II}$ in FIG. 2 is thinner, about 17 $\mu$m, and the undercut $U^{II}$ is considerably less than $U^I$ in FIG. 1. The metal layer $2^{III}$ is very thin, for instance about 5 $\mu$m, and requires only a short etching time. The undercut $U^{III}$ is here neglectable even at very small width of the conductors formed by the metal layer.

Figure 5:
Figure 6:
Figure 7:
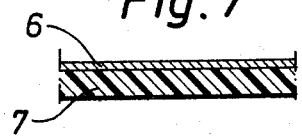
Figure 8:
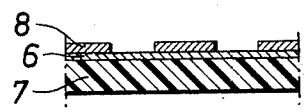

FIGS. 4 – 10 illustrate a method according to the invention. On a temporary base 5, FIG. 4, of aluminum a thin copper layer 6, FIG. 5, with a thickness less than 17 $\mu$m, is deposited by electroplating. The material according to FIG. 5 is thereafter laminated or moulded with a final, insulating base 7, for instance of glass fibre reinforced epoxy resin, with the copper layer facing the final base, FIG. 6, whereupon the temporary base 5 is removed, for instance by peeling or by etching. On the product, FIG. 7, thus obtained an etch resist 8, FIG. 8, is then applied, which corresponds to a desired pattern, whereupon the uncovered portions of the thin copper layer are removed by etching, FIG. 9. After dissolving the etch resist 8 the final printed circuit is obtained, FIG. 10.

Figure 9:
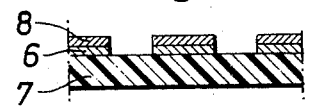
Figure 10:

The material shown in FIG. 7 can, as shown in FIGS. 8 and 9, be used as such, in which case the advantage is obtained that the undercut is neglectable. This advantage can, however, be maintained also if it is desired to produce wiring patterns with increased conductor thickness, and FIGS. 12 – 14 show how this can be achieved.

On an insulating base 11 a copper layer 12 with a thickness of, for instance, 5 $\mu$m has been deposited by means of a method according to the invention. For increasing the thickness of the conductors a mask 13 corresponding to the negative of the desired conductor pattern is first applied to the copper layer 12, as shown in FIG. 12. Thereafter further copper 16 is deposited on the layer 12 by electroplating until the desired conductor thickness, for instance 35 $\mu$m, has been obtained whereupon a different metal serving as an etch resist 17 is applied to the deposited copper, all as shown in FIG. 13. Finally the mask 13 is dissolved and the thin copper layer covered by the mask is removed by etching which takes only a short time. The result is shown in FIG. 14 from which appears that a conductor with a considerable thickness, for instance 35 $\mu$m, and with very accurate dimensions has been achieved, the latter thanks to the absence of mentionable undercut.

Figure 12:
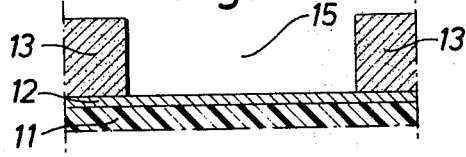
FIGS. 12 – 14 illustrate a method according to the invention in which the thickness of the wiring pattern forming portions of a thin metal layer are increased by plating, whereupon the other portions of the metal layer are removed by etching.
Figure 13:
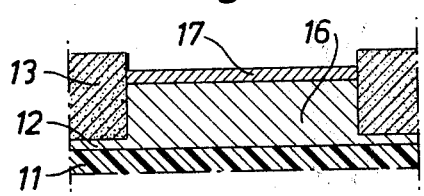
Figure 14:
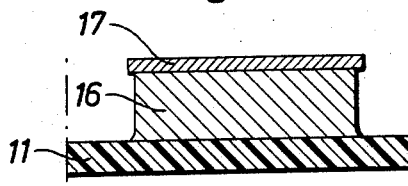

In FIG. 15 a so called through-holes plating method is illustrated which can suitably be carried out simultaneously with plating for achieving increased conductor thickness are illustrated in FIGS. 12 – 14. An insulated base 21 is provided on each side thereof with a very thin copper layer 22a and 22b respectively, by a method according to the invention. In the composite material through-going holes 24 have been made, for instance by drilling. After pretreatment of the holes and after masking in a known manner plating is carried out whereby the deposited copper material is applied on the unmasked portions of the thin copper layer and on the inner walls of the holes until the desired plating thickness has been achieved. After removing the mask and etching the underlying portions of the copper layer the final product shown in FIG. 15 is obtained. It appears that the deposited copper layers 23a on the thin copper layers and the deposited copper layers 23b on the walls of the holes 24 become approximately equally thick and have good connection to each other which is of great importance from the point of view of reliability.

The temporary base used in the method according to the invention need and should not be thicker than what is required for forming and supporting the thin copper layer so that the composite material consisting of the temporary base and the copper layer can be handled comfortably during the further processing. The temporary base should preferably be of the throw-away type so that is can be destroyed after use. The thickness of the temporary base depends on the stiffness of the materials used but should suitably be not more than 0.2 mm, preferably not more than 0.1 mm and can be, for instance, about 0.03 mm. A further advantage with the invention is that the temporary base can serve as protection against oxidation, scratching and other damage of the thin metal layer during transport, storing and mechanical treatment of the laminate. The temporary base is then removed in connection with the manufacture of the printed circuit.

Another advantage is related to the aforementioned presence of through-going holes, so called micropores, in the copper layer, said micropores being difficult to avoid in an electroplating process. These micropores create, as mentioned, difficulties, since part of the resin flows up to the surface of the copper through the micropores during the high pressure moulding applied for the manufacture of, for instance, glass cloth reinforced epoxy resin laminate. The patches of epoxy resin on the copper surface are highly harmful in the manufacture of the printed circuit both in the etching, plating and soldering steps. The thinner the copper foil the more difficult it is to avoid this problem. The present invention solves the problem, since the temporary base constitutes an effective barrier during the moulding operation preventing any flow-up of resin on the surface of the copper layer.

Before the temporary base with an even copper layer is moulded to the final base it is suitable to subject the copper to a surface treatment for improving the bond between the copper and the resin of the final base. This surface treatment often makes the surface of the copper uneven. The thickness of the deposited copper layer is therefore calculated as an average thickness. An average thickness of 10 $\mu$m corresponds to a surface weight of about 87 g/m².

The method according to the invention is further illustrated by the following examples.

EXAMPLE 1

An aluminum foil (50 μm) was washed in a cleaning solution consisting of water, sodium carbonate and sodium phosphate. The foil was then washed in water and was thereafter electroplated in a water solution containing

| | |
|---|---|
| Cu(CN)$_2$ | 25 g/l |
| NaCN | 20 g/l |
| Na$_2$CO$_3$ | 30 g/l |
| NaOH | 3 g/l |
| Rochelle salt | 70 g/l | for 2 minutes at 45° C with a current density of 15 mA/cm$^2$. After washing the foil was plated for 2 minutes with a current density of 50 mA/cm$^2$ at a temperature of 42° C in a water bath containing

| | |
|---|---|
| CuSO$_4$ | 170 g/l |
| H$_2$SO$_4$ | 50 g/l |

Thereafter the electroplating was carried out in the same bath at a current density of 200 mA/cm$^2$ during 2 minutes for achieving a surface with high crystallinity and good adhesion to epoxy resin. A copper layer with a thickness of 5 μm was obtained.

After the plating the aluminum foil was washed and dried whereupon it was placed on a few sheets of an epoxy resin inpregnated glass web with the copper coated surface facing said sheets. The laminate was moulded under pressure and the aluminum foil could be peeled off after the moulding operation.

The copper layer bound to the final laminate had an adhesion to the base, a so-called peel strength, of 8.5 lbs/in measured according to the standardized measurinng method ASTM D/1867 after increasing the thickness of the copper layer by plating to 35 μm. The thickness of the metal layer obtained by plating can be changed in a simple manner by varying the plating time and/or the current density. On the laminate thus obtained a wiring pattern for the desired printed circuit was thereafter etched in a manner known per se.

EXAMPLE 2

A laminate was produced in the same manner as according to Example 1 but the aluminum foil was etched away in hydrochloric acid instead of being removed mechanically by tearing. The peel strength was 9.0 lbs/in.

EXAMPLE 3

A zinc foil (80 μm) was plated in a bath consisting of

| | |
|---|---|
| CuSO$_4$ . 5H$_2$O | 220 g/l |
| H$_2$SO$_4$ | 100 g/l | during 2 minutes at 20° C with a current density of 100 mA/cm$^2$. After washing the foil was plated during 20 seconds at room temperature in the same plating bath with a current density of 500 mA/cm$^2$. Thereafter plating took place in the same bath for 30 seconds at a current density of 50 mA/cm$^2$. A copper layer of 6 μm was thereby obtained. After moulding according to Example 1 the zinc foil was etched by means of hydrochloric acid. On the final laminate the copper layer had a peel strength of 12 lbs/in.

EXAMPLE 4

A steel foil (100 μm) was plated in a bath consisting of

| | |
|---|---|
| CuP$_2$O$_7$ | 50 g/l |
| K$_2$P$_2$O$_7$ | 250 g/l | for 2 minutes at 35° C with a current density of 24 mA/cm$^2$. After washing the foil was plated for 3 minutes at 35° C in a plating bath consisting of

| | |
|---|---|
| CuSO$_4$ . 5H$_2$O | 225 g/l |
| H$_2$SO$_4$ | 100 g/l | at a current density of 100 mA/cm$^2$.

The foil was thereafter plated at 35° C in the same bath for 20 seconds at a current density of 500 mA/cm$^2$. Thereafter the foil was plated once again at 35° C in the same bath for 20 seconds at a current density of 100 mA/cm$^2$.

A copper layer with a thickness of 10 μm was obtained. After moulding as according to Example 1 the steel foil could be peeled off. The copper layer of the final laminate had a peel strength of 10.5 lbs/in.

EXAMPLE 5

An aluminum foil was plated with a 5 μm thick copper layer in the manner described in Example 1. Thereafter the foil was moulded under heat and pressure to a 75 μm thick plastic film of the type polyethylene terephthalate with the copper coated surface facing the film. As binding agent heat curing polyurethane resin was used. After the bonding of the metal foil to the plastic film the aluminum foil could be peeled off. A flexible laminate consisting of a plastic film coated with a 5 μm thick copper layer was obtained.

EXAMPLE 6

An aluminum foil was plated with a 10 μm thick copper layer in the manner described in Example 1. Thereafter the foil was placed on a sheet of "nonwoven" cloth of polyester fibre which had been inpregnated with a partly cured epoxy resin, the copper coated surface of he foil facing the impregnated cloth. After moulding at a raised temperature the aluminum foil could be peeled off. The copper clad laminate obtained had good flexibility.

EXAMPLE 7

An aluminum foil was plated with a 3 μm thick copper layer in the manner described in Example 1. Thereafter the copper clad surface of the foil was coated with a 75 μm thick layer of partly cured epoxy resin of the heat resistnt type. A 1 mm thick copper plate was also coated with a 75 μm thick layer of partly cured epoxy resin of the same type. By electrolytical treatment the copper plate had been rendered a surface giving good adhesion to epoxy resin. The foil and the copper plate was moulded together under heat and pressure with the epoxy resin coated surfaces facing each other. Thereafter the aluminum foil was etched away in hydrochloric acid. The final laminate consisted of a copper plate and a 3 μm thick copper layer with an electrically insulating layer of epoxy resin therebetween. The copper plate assured effective dissipation of heat from a heated article which was soldered to the thin copper layer.

From an economical point of view the most advantageous temporary base to be used in the method according to the invention is an aluminum foil which is cheap, easy to etch and gives less dangerous waste products from the point of view of environment protection. The use of such a foil is, however, not free from problems. It is difficult to obtain a good adhesion in the application by plating of a metal layer on an aluminum foil. This is true i.a. if it is desired to apply a copper layer on the foil. In this case it is usually necessary to utilize a cyanide containing plating bath which gives rise to waste products which are dangerous to the environment. The handling of cyanides during the plating process is also connected with risks.

Figure 11:
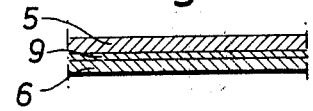
FIG. 11 illustrates a modified method.

According to an embodiment of the invention a temporary base of aluminum foil is used which is coated with a thin layer of zinc or thin, preferably with a thickness less than 2 μm, and the thin metal layer is then applied to the zinc or tin coating by electroplating. The adhesion between the metal, for instance copper, and the zinc or tin layer is very good, and one can also avoid the use of cyanide containing solutions, if desired. FIG. 11 shows how a temporary base 5 of aluminum has been provided with a thin layer of zinc 9 on which a copper coating 6 has thereafter been deposited by electroplating.

EXAMPLE 8

A hard-rolled aluminum foil was treated for 1 minute at room temperature in a zincate solution consisting of

| | |
|---|---|
| ZnO | 95 g/l |
| NaOH | 520 g/l |

After the treatment it was found that the foil was covered by a layer of zinc. The zinc layer was dissolved by immersion in 50 % $HNO_3$, whereby a clean aluminum surface was obtained. The aluminum foil was thereafter treated once again in the above-mentioned zincate solution for 1 minute at room temperature, whereby a thin zinc layer with good adhesion to the aluminum foil was obtained.

The aluminum foil thus treated was plated with nickel in a Watts solution consisting of

| | |
|---|---|
| Nickel sulphate | 300 g/l |
| Nickel chloride | 45 g/l |
| Boric acid | 180 g/l | for 3 minutes at 50° C and a current density of 50 $mA/cm^2$. Thereafter the plating was continued for 1 minute in the same bath at 50° C and with a current density of 150 $mA/cm^2$.

The plated aluminum foil was placed on a few sheets of epoxy resin impregnatd glass cloth with the nickel coated surface facing said cloth. The laminate was moulded and the aluminum foil with the zinc layer could be dissolved by means of $H_2SO_4$. A laminate coated with a 5 μm thick nickel layer was obtained. The strength of the bond between the nickel layer and the epoxy glass fibre laminate, the peel strength, measured on a 35 μm thick foil was 12 lbs/in.

EXAMPLE 9

A hard-rolled aluminum foil was immersed for 3 minutes in a 5% NaOH-solution. Thereafter the foil was immersed for 1 minute in a zincate solution of

| | |
|---|---|
| NaOH | 60 g/l |
| ZnO | 6 g/l |
| $FeCl_3 . 6H_2O$ | 2 g/l |
| Rochelle salt | 55 g/l |
| $NaNO_3$ | 1 g/l |

The zinc-treated aluminum foil was plated with brass for 6 minutes at 60° C and a current density of 40 $mA/cm^2$ in a bath containing

| | |
|---|---|
| CuCN | 55 g/l |
| $ZN(CN)_2$ | 31 g/l |
| NaCN | 95 g/l |
| $Na_2CO_3$ | 35 g/l |
| $NH_4OH$ | 10 g/l |

A laminate was produced in the same manner as according to Example 8. The temporary base could be dissolved by means of $H_2SO_4$ after the moulding. A laminate with a 4 μm thick brass layer was obtained. The proportion between copper and zinc of the brass was about 70:30. The peel strength was 6 lbs/in.

EXAMPLE 10

A hard-rolled aluminum foil was zinc-treated in the same manner as according to Example 8. Thereafter the foil was plated with brass for 5 minutes at room temperature and a current density of 50 $mA/cm^2$ in a bath containing

| | |
|---|---|
| CuCN | 20 g/l |
| $Zn(CN)_2$ | 45 g/l |
| NaCN | 50 g/l |
| $Na_2CO_3$ | 32 g/l |
| NaOH | 30 g/l |
| Rochelle salt | 5 g/l |

A laminate was produced in he same manner as according to Example 8. The temporary base could be dissolved by means of $H_2SO_4$ after the moulding. A laminate with a 5 μm thick layer of brass was obtained. The proportion between copper and zinc of the brass was about 40:60. The peel strength was 6 lbs/in.

EXAMPLE 11

An aluminum foil which had been zinc-treated according to Example 8 was plated at room temperature for 1, 2, 5 or 10 minutes respectively at a current density of 60 $mA/cm^2$ in an acid copper solution containing

| | |
|---|---|
| $CuSO_4 . 5H_2O$ | 200 g/l |
| $H_2SO_4$ | 70 g/l |

Thereafter the foil was plated at room temperature in the same solution for 20 seconds at a current density of 200 mA/cm$^2$ and thereafter for a further period of 20 seconds at a current density of 50 mA/cm$^2$.

Laminates were produced in the same manner as according to Example 8. After the moulding the temporary base was peeled off. The laminates were coated with a copper layer with a thickness of 4 $\mu$m, 5 $\mu$m, 8 $\mu$m and 13 $\mu$m respectively. The adhesion to the final base was about 11 lbs/in.

The thickness of the metal layer obtained by plating can thus simply be changed by varying the plating time which is shown in Example 11.

FIG. 16 illustrates schematically a continuous process according to the invention for the manufacture of a material for printed circuits consisting of an aluminum foil with a very thin copper coating deposited thereon. An aluminum foil 32 is drawn from a storage roll 31 and is first led through a cleaning bath 33 and thereafter through a washing bath 34 containing Na$_2$CO$_3$, Na$_3$PO$_4$ or NaOH whereafter the foil is pretreated by means of a zincate or stannate solution 35 for depositing a thin layer of zinc and tin, respectively, on the aluminum foil. After renewed washing in a suitable liquid 36 the foil is led down into a solution 37 in a device for electroplating the surface of the foil coated with zinc and tin, respectively, for obtaining a thin copper layer thereon. The solution 37 can be, for instance, a solution of copper sulphate, copper pyrophosphate or copper cyanide. The foil on the roll 40 serves as a cathode and the plate 41 as an anode at the electroplating procedure. After the plating the product is washed in a bath 43 and is dried by means of a device 38, whereupon the copper coated aluminum foil 42 thus obtained is wound up on the roll 39. The described process serves only as an illustration. Certain process steps can be eliminated and other can be added. Thus, for instance, further plating steps can be required in certain cases.

The present invention also relates to a modified method which is especially advantageous technically and economically in the manufacture of certain types of metal coated plastic films. Accordingg to this method the thin metal layer carried by the temporary base is coated with a layer of a resin solution or a prepolymer or a solution of a prepolymer. It is also possible to use resin dispersions, melts or other liquid phases of the resin or its prepolymer. The deposited layer is transformed to solid phase for instance by evaporation of the solvent and polymerizing the prepolymer. Thereafter the temporary base can be removed, whereupon a plastic film coated with the very thin metal layer is obtained. Examples of metal coated plastic films which can be manufactured with advantage by means of this process are films of polybenzoxazole, polybenzimidazole, polyimide and polybutadiene resins. These plastics have good dielectric properties and good heat resistance which is advantageous in printed circuitry. Such metal coated plastic films find use for instance in the manufacture of flexible printed circuits.

FIG. 17 illustrates schematically a continuous process according to this modified method. From a storage roll 51 for a foil 52 which, if desired, can consist of the final product 42 obtained by the process according to FIG. 16, the foil is drawn horizontally over a support 53, it being assumed that the underside of the horizontal foil is constituted by a temporary base in the form of a metal foil 52a and the upper side is constituted by a metal foil deposited on the temporary base by means of electroplating and consisting of a thin layer 52b, for instance of copper. From a container 54 for a fluid prepolymer 55 of a resin suitable for forming a final, insulating base of the material for printed circuits to be produced the metal layer is coated with the prepolymer which is thereafter brought to final polymerization by means of a suitable apparatus 57 whereby a strong, flexible film 56 is obtained. After removing the metal foil 52a which is wound up on a roll 59 the film 56 with the thin metal coating bonded thereto is wound up on a roll 58. For the sake of simplicity further process steps which can be required, for instance pretreatment of the component foil materials have not been shown in FIG. 17. From the roll 59 the metal foil can go to replating, if desired. Instead of peeling off the temporary base the latter can be removed in any other manner for instance by etching, which can be carried out with advantage in immediate connection with the manufacture of the printed circuit.

EXAMPLE 12

An aluminum foil with a copper layer with a thickness of 5$\mu$m was produced according to Example 11. The free copper surface was coated with a layer of a solution consisting of

| | |
|---|---|
| Polybenzoxazole, prepolymer | 15 parts by weight |
| Dimethylacetamide | 85 parts by weight |

The Dimethylacetamide was evaporated in an oven while gradually increasing the temperature from 60° C to 160° C for 60 minutes. Thereafter the temperature was increased to 300° C which temperature was maintained for 45 minutes. During the last mentioned treatment which was carried out in a nitrogen gas atmosphere the prepolymer underwent a chemical reaction so that an aromatic polybenzoxazole was obtained.

Thereafter the aluminum foil was etched away by means of hydrochloric acid. As a result a 25$\mu$m thick film of polybenzoxazole plastic coated with a 5$\mu$m thick copper layer was obtained. The plastic film proper had high flexibility and a very good heat resistance at temperatures up to 250° C. The tensile strength was 1050 kp/cm$^2$ at 20° C.

The invention is not limited to the embodiment examples shown and described since they can be modified in different manners within the scope of the invention.

I claim:

1. A method for the production of a material for printed circuits by transferring a metal layer via a temporary base to an insulating, final base, comprising electroplating a continuous layer of copper or a copper alloy to a temporary base of a throw-away type, in the form of a foil of aluminum or alloy thereof have a thickness less than 200$\mu$m, electroplating copper or a copper alloy for at least one further step to form at least one further layer by changing at least one of the plating variables of current density and composition of the electroplating bath of the first step to improve the adhesion to the final base, said electroplated layers having a combined thickness of 1-17 $\mu$m measured by weight, placing at least one side of a material consisting of partially cured fiber reinforced thermosetting plastic towards such electroplated layers of copper or copper alloy of such a temporary base, laminating under heat and pressure to cure said plastic thereby forming the final base and bringing about an adhesion between the electroplated layers and the final base amounting to at least 6 lbs/in and removing the temporary base in connection with the printed circuit manufacturing by etching, stripping, tearing off or a combination thereof, leaving the thin, electroplated metal layers on the final base.

2. A method according to claim 1 characterized in that the combined thickness of the thin metal layers is 1-15 $\mu$m.

3. A method according to claim 1 characterized in that the combined thickness of the thin metal layers is 2-10 $\mu$m.

4. A method according to claim 1 characterized in that the combined thickness of the thin metal layers is about 5 $\mu$m.

5. A method according to claim 1 characterized in that the final, insulating base consists of glass fiber reinforced epoxy resin.

6. A method according to claim 1 characterized in that the surface of the temporary base facing said thin metal layers is treated, before the electroplating process, for assuring a satisfactory adhesion to the deposited metal layers.

7. A method according to claim 1 characterized in that the surface of the temporary base facing said thin metal layers is coated, before the electroplating process, with a layer of zinc, tin or their alloys.

8. A method according to claim 1 characterized in that said temporary base in the form of a foil of aluminum, or an alloy thereof is continuously fed through an apparatus in which said thin, continuous layers of copper or a copper alloy are deposited by electroplating on at least one side of the temporary base.

9. A method for the production of a material for printed circuits by transferring a metal layer via a temporary base to an insulating, final base, comprising electroplating a continuous, even layer of copper or a copper alloy to a temporary base of a throw-away type, in the form of a foil of aluminum or alloy thereof having a thickness less than 200 $\mu$m, electroplating copper or a copper alloy for at least one further step to form at least one further layer having an uneven surface by changing at least one of the plating variables of current density and composition of the electroplating bath of the first step to improve the adhesion to the final base, said electroplated layers having a combined thickness of 1-17 $\mu$m measured by weight, placing at least one side of a material consisting of partially cured fiber reinforced thermosetting plastic towards such electroplated layers of copper or copper alloy of such a tempoarary base, laminating under heat and pressure to cure said plastic thereby forming the final base and bringing about an adhesion between the electroplated layers and the final base amounting to at least 6 lbs/in and removing the temporary base in connection with the printed circuit manufacturing by etching, stripping, tearing off or a combination thereof, leaving the thin, electroplated metal layers on the final base.

* * * * *

UNITED STATES PATENT AND TRADEMARK OFFICE
CERTIFICATE OF CORRECTION

PATENT NO. : 3,990,926
DATED : November 9, 1976
INVENTOR(S) : Jiri K. KONICEK

It is certified that error appears in the above-identified patent and that said Letters Patent are hereby corrected as shown below:

[56] first line under "UNITED STATES PATENTS" cancel
"1,157,619  7/1969  UK".

Column 1, line 47, correct spelling of -- especially --.

Column 2, line 7, cancel "or" and insert -- for --.

Column 2, line 25, correct spelling of -- copper --.

Column 3, line 12, cancel "bending" and insert -- bonding --.

Column 4, line 19, cancel "sea-" and insert -- sepa- --.

Column 4, line 53, after "thickness" (second occurrence) cancel "a" and insert -- of --.

Column 4, line 39, cancel "zin" and insert -- zinc, --.

Column 7, line 40, cancel "rinng" and insert -- ring --.

Column 8, line 2, after "etched" insert -- away --.

Column 8, line 50, cancel "inpreg-" and insert -- impreg- --.

Column 8, line 52, cancel "he" and insert -- the --.

Column 8, line 62, correct spelling of -- resistant --.

Column 9, line 23, cancel "thin" and insert -- tin --.

Column 10, line 23, cancel "ZN" and insert -- Zn --.

Column 10, line 51, cancel "he" and insert -- the --

UNITED STATES PATENT AND TRADEMARK OFFICE
CERTIFICATE OF CORRECTION

PATENT NO. : 3,990,926
DATED : November 9, 1976
INVENTOR(S) : Jiri K. KONICEK

It is certified that error appears in the above-identified patent and that said Letters Patent are hereby corrected as shown below:

Column 11, line 43, correct spelling of -- According --.

Column 12, line 33, cancel "Dimethylacetamide" and insert -- dimethylacetamide --.

Column 12, line 58, cancel "have" and insert -- having --.

Signed and Sealed this

First Day of March 1977

[SEAL]

Attest:

RUTH C. MASON
Attesting Officer

C. MARSHALL DANN
Commissioner of Patents and Trademarks